(12) United States Patent
Higuchi et al.

(10) Patent No.: US 6,343,030 B1
(45) Date of Patent: Jan. 29, 2002

(54) SEMICONDUCTOR DEVICE AND PIN ARRANGEMENT

(75) Inventors: Tsuyoshi Higuchi; Yoshinori Okajima, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 619 days.

(21) Appl. No.: 08/754,758

(22) Filed: Nov. 21, 1996

(30) Foreign Application Priority Data

Jul. 4, 1996 (JP) .............................................. 8-174985

(51) Int. Cl.⁷ ................................................ G11C 13/00
(52) U.S. Cl. ........................................... 365/52; 365/63
(58) Field of Search .............................. 365/51, 52, 63; 361/760, 767, 773; 174/260, 261; 439/74, 65

(56) References Cited

U.S. PATENT DOCUMENTS

| | | | | |
|---|---|---|---|---|
| 4,586,162 A | * | 4/1986 | Murai | .......................... 365/51 |
| 5,319,591 A | * | 6/1994 | Takeda | .......................... 365/52 |
| 5,331,591 A | * | 7/1994 | Clifton | .......................... 365/51 |
| 5,513,076 A | * | 4/1996 | Werther | ....................... 361/767 |
| 5,557,564 A | * | 9/1996 | Haraguchi | .................... 365/51 |
| 5,572,457 A | * | 11/1996 | Michael | ........................ 365/63 |

* cited by examiner

Primary Examiner—A. Zarabian
(74) Attorney, Agent, or Firm—Arent Fox Kintner Plotkin & Kahn, PLLC

(57) ABSTRACT

A semiconductor device connected to at least one semiconductor device of the same type. The semiconductor device includes first pins, provided on a first side of the semiconductor device, for receiving signals commonly used with the at least one semiconductor device, and second pins, provided on a second side of the semiconductor device substantially perpendicular to the first side, for being connected to signal lines which are not connected to the at least one semiconductor device.

18 Claims, 8 Drawing Sheets

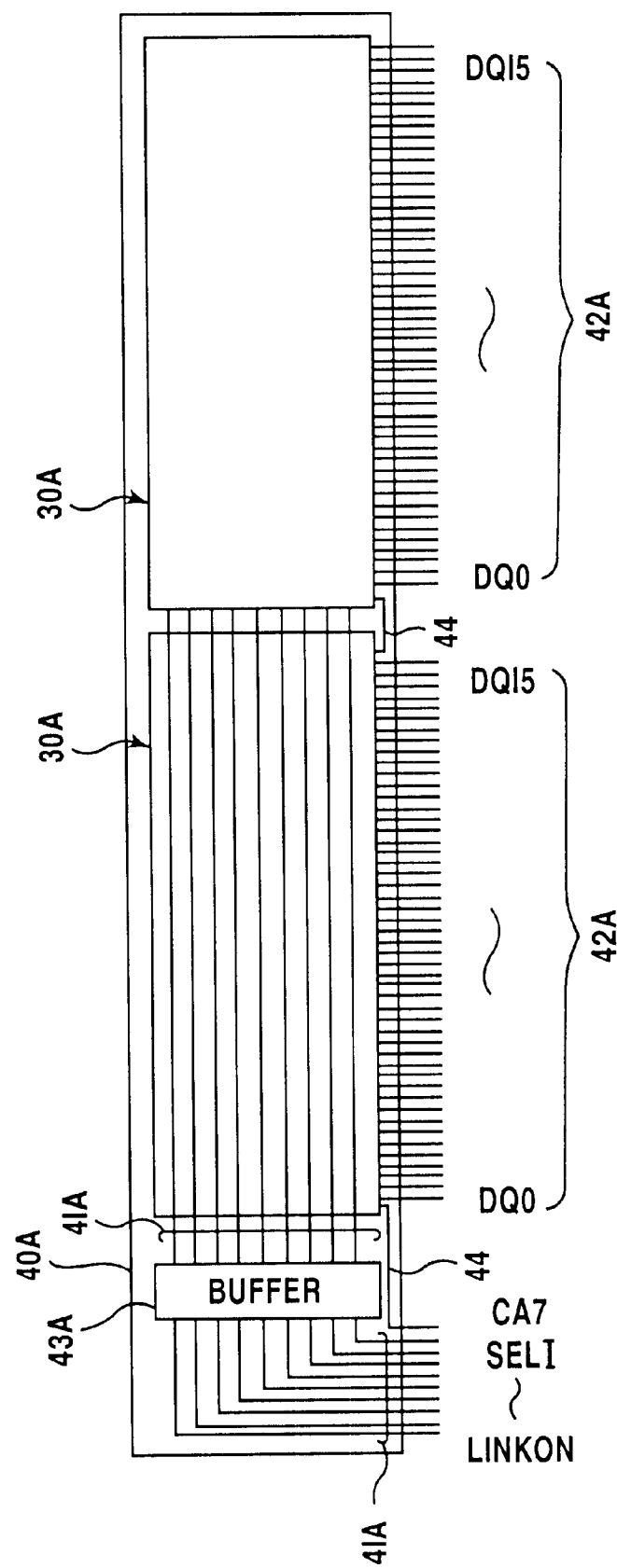

SEMICONDUCTOR DEVICE AND PIN ARRANGEMENT

BACKGROUND OF THE INVENTION

1. Field of the Invention

The present invention generally relates to semiconductor devices and systems using semiconductor devices, and particularly relates to a pin arrangement of semiconductor devices and a pin arrangement of systems using semiconductor devices.

2. Description of the Related Art

While semiconductor chips implementing semiconductor circuits are required to meet a demand for cost cuts, operations of and data transmission between semiconductor devices are expected to have increasing speed. To achieve a speed increase in data transmission, buses connecting between semiconductor devices need to conduct data transfer using higher frequencies for signal transmission.

Pin arrangements of traditional semiconductor devices include an arrangement providing an array of pins at equal intervals on one side of a rectangular chip, an arrangement providing such an array on each of two opposing sides of a rectangular chip, an arrangement furnishing such an array on each of the four sides of a rectangular chip, and an arrangement placing pins beneath a lower surface of a rectangular chip.

The arrangement providing pins on only one side of a rectangular chip has a limitation on the number of pins which can be arranged on the side, thereby restricting the number of pins per unit area on a chip board. The arrangement providing a pin array on two or more sides of a rectangular chip or the arrangement furnishing pins beneath the chip lower surface have a problem in that layouts of various signal lines becomes complicated when a plurality of these chips are arranged and connected with each other. In this case, a large number of wiring layers are needed for signal-line layout, and a number of branches become larger.

When wiring patterns become more complex and branches increase in number, reflections of signals propagating through wires become significant, thereby adversely affecting signal transmission using high frequencies. Namely, high-speed data transfer is undermined. Further, increases in the number of wiring layers and complexity of wiring patterns leads to a hike in the cost of the semiconductor devices.

Accordingly, there is a need for a technique which can simplify wiring patterns on a board with semiconductor devices implemented thereon.

SUMMARY OF THE INVENTION

Accordingly, it is a general object of the present invention to provide a technique which can satisfy the need described above.

It is another and more specific object of the present invention to provide a technique which can simplify wiring patterns on a board with semiconductor devices implemented thereon.

In order to achieve the above objects according to the present invention, a semiconductor device connected to at least one semiconductor device of the same type includes first pins, provided on a first side of the semiconductor device, for receiving signals commonly used with the at least one semiconductor device, and second pins, provided on a second side of the semiconductor device substantially perpendicular to the first side, for being connected to signal lines which are not connected to the at least one semiconductor device.

Since the semiconductor device described above has the first pins used for common signals on the first side and the second pins used for unshared signals on the second side perpendicular to the first side, a plurality of such semiconductor devices can be arranged in a straight line, and signal lines for transferring the common signals can be laid out straight along said straight line without having branches and with no space conflict with other signal lines used for the unshared signals. This configuration can simplify wiring patterns on a board with these semiconductor devices implemented thereon.

Further, in order to achieve the above objects according to the present invention, a device includes a board, first signal lines provided on the board to extend straight in a first direction, semiconductor packages connected to the first signal lines to share the first signal lines, and second signal lines provided on the board to extend in a second direction substantially perpendicular to the first direction, the second signal lines being provided separately for each of the semiconductor packages, wherein each of the semiconductor packages includes first pins provided on a first side of each of the semiconductor packages and connected to the first signal lines, and second pins provided on a second side of each of the semiconductor packages substantially perpendicular to the first side and connected to the second signal lines.

The device described above has a configuration which allows the first signal lines for transferring the common signals to extend straight without having branches and with no space conflict with the second signal lines used for the unshared signals. This configuration can simplify wiring patterns on the board on which these semiconductor devices are implemented.

Further, a device according to the present invention includes a first board, first signal lines provided on the first board, and a plurality of semiconductor devices mounted on the first board, wherein each of the semiconductor devices includes a second board, second signal lines provided on the second board to extend straight in a first direction, semiconductor packages connected to the second signal lines to share the second signal lines, third signal lines provided on the second board to extend in a second direction substantially perpendicular to the first direction, the third signal lines being provided separately for each of the semiconductor packages, and node portions provided at an end of the second signal lines and the third signal lines and arranged in a line on one side of the second board to be connected to the first signal lines, wherein each of the semiconductor packages includes first pins provided on a first side of each of the semiconductor packages and connected to the second signal lines, and second pins provided on a second side of each of the semiconductor packages substantially perpendicular to the first side and connected to the third signal lines.

The device describe above has a configuration which allows the mounting of a SIMM (or a DIMM) on another board so as to built a memory device of a large scale using a small number of wiring layers and a simple wiring layout. Since there is no branch stemming from the signal lines, signal reflections can be avoided to achieve high-speed data transmission using high-frequency signals in the large-scale memory device.

Other objects and further features of the present invention will be apparent from the following detailed description when read in conjunction with the accompanying drawings.

BRIEF DESCRIPTION OF THE DRAWINGS

FIG. 7 is an illustrative drawing showing a line layout when a plurality of the memory devices of FIG. 6 are arranged on a board to form SIMM or DIMM; FIG. 7 is mounted on a board.

DETAILED DESCRIPTION OF THE PREFERRED EMBODIMENTS

In the following, a principle and embodiments of the present invention will be described with reference to the accompanying drawings.

Figure 1:
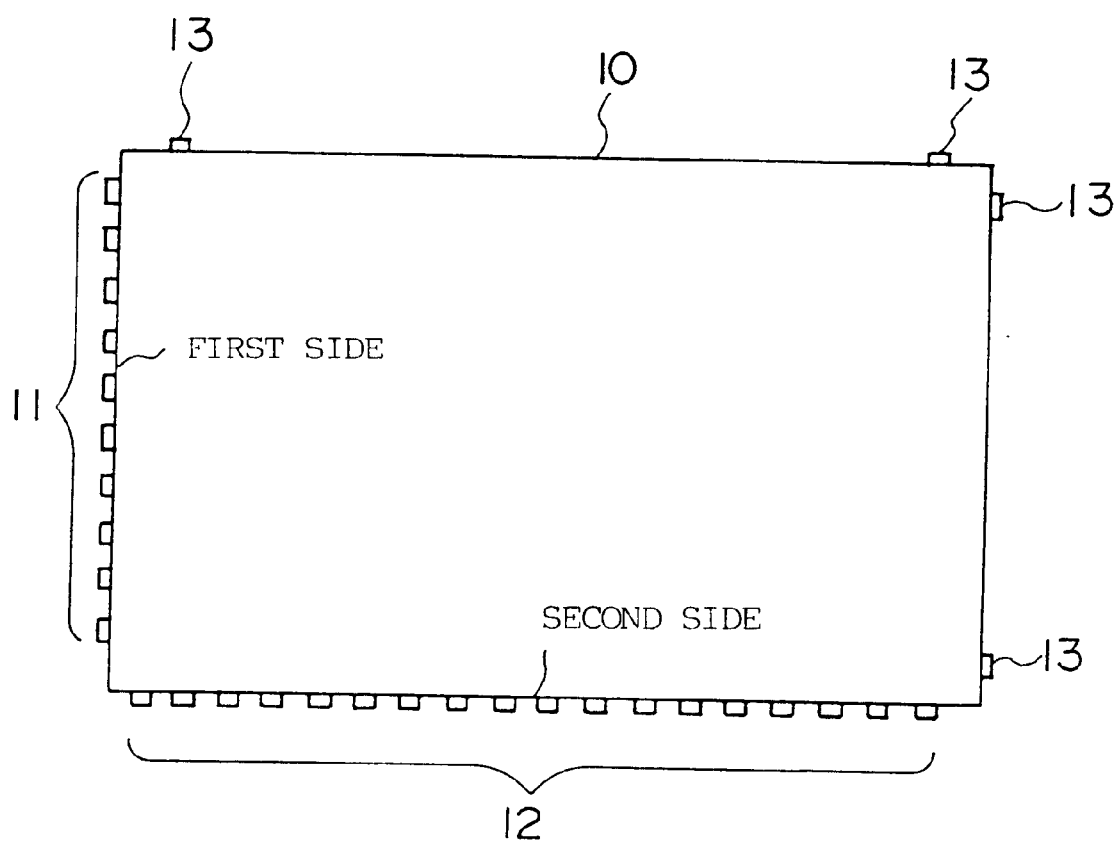
FIG. 1 is an illustrative drawing showing a pin arrangement of a semiconductor device according a principle of the present invention.

FIG. 1 is an illustrative drawing showing a pin arrangement of a semiconductor device according to a principle of the present invention. A semiconductor device 10 includes control-signal pins 11 arranged on a first side, data-input/output pins 12 arranged on a second side substantially perpendicular to the first side, and power-input pins 13 provided on arbitrary sides of the semiconductor device 10. The principle of the present invention basically assumes that a plurality of the semiconductor devices 10 are provided on a board. Then, pins for signals commonly used by all the semiconductor devices are provided on the first side, and pins for signals different between the semiconductor devices are furnished on the second side. The pins on the second side are thus connected to signal lines which are not connected to other semiconductor devices. Here, the semiconductor device means a semiconductor chip, or, in a strict sense, a device inclusive of a semiconductor package storing the semiconductor chip.

The control-signal pins 11 are used to input control signals for controlling the semiconductor device 10 and to input address signals (in the case of a memory device) or the like. In the principle of the present invention, the control-signal pins 11 on the first side are used for receiving signals commonly used with other semiconductor devices 10. The data-input/output pins 12 on the second side are used for inputting/outputting (exchanging) signals different between the semiconductor devices 10, and are generally used for inputting/outputting data signals. The data-input/output pins 12 may include pins dedicated for data input, pins dedicated for data output, and/or pins usable for both the data input and the data output. The power-input pins 13 are used for supplying power voltage and/or reference voltage to the semiconductor device 10, and may be provided on any side including the first side and the second side.

Figure 2:
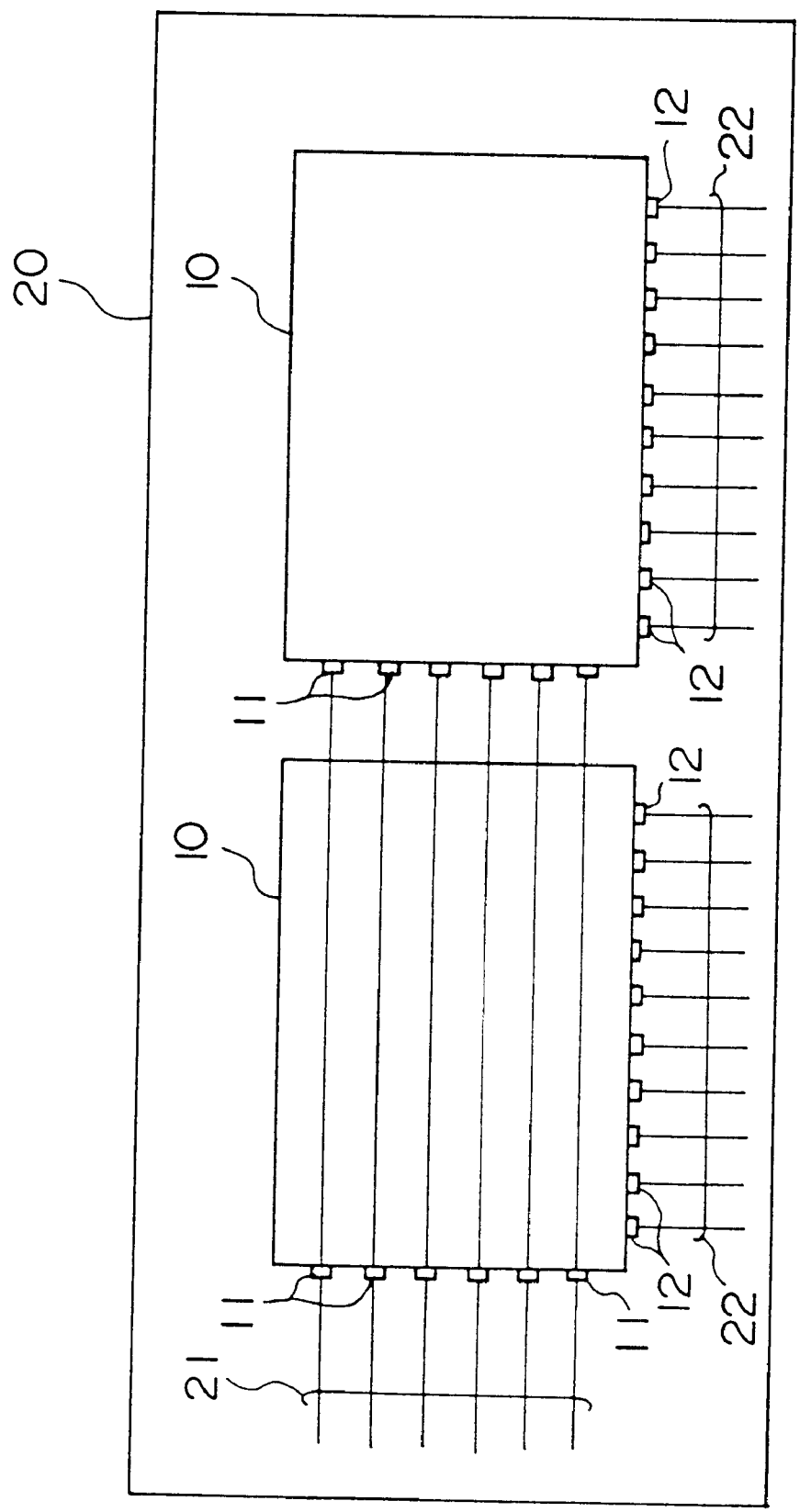
FIG. 2 is an illustrative drawing showing an arrangement of semiconductor devices and a layout of wiring connections between semiconductor devices when a plurality of the semiconductor devices of FIG. 1 are arranged on a board.

FIG. 2 is an illustrative drawing showing an arrangement of semiconductor devices and a layout of wiring connections between semiconductor devices when a plurality of the semiconductor devices 10 of FIG. 1 are arranged on a board. As shown in FIG. 2, control-signal lines 21 are laid out to run straight on a board 20. A plurality (two in the figure) of the semiconductor devices 10 are mounted on the board 20 such that the first sides thereof lie across the control-signal lines 21. The same control-signal lines 21 are connected to the control-signal pins 11 of each semiconductor device 10. Bus lines 22 are also provided on the board 20, and are connected to the data-input/output pins 12 of the respective semiconductor devices 10. In FIG. 2, wiring lines running under the semiconductor devices 10 are shown as if the semiconductor devices 10 were transparent.

In FIG. 2, the control-signal pins 11 and the data-input/output pins 12 are provided on two different sides of each semiconductor device 10, respectively, and these two sides are perpendicular to each other. Because of this, the control-signal lines 21 laid out to run straight for supplying signals to the control-signal pins 11 do not run across portions of the semiconductor device 10 where the data-input/output pins 12 are provided. Thus, the control-signal lines 21 do not cross the bus lines 22, even though the control-signal lines 21 are provided as straight lines.

Figure 3:
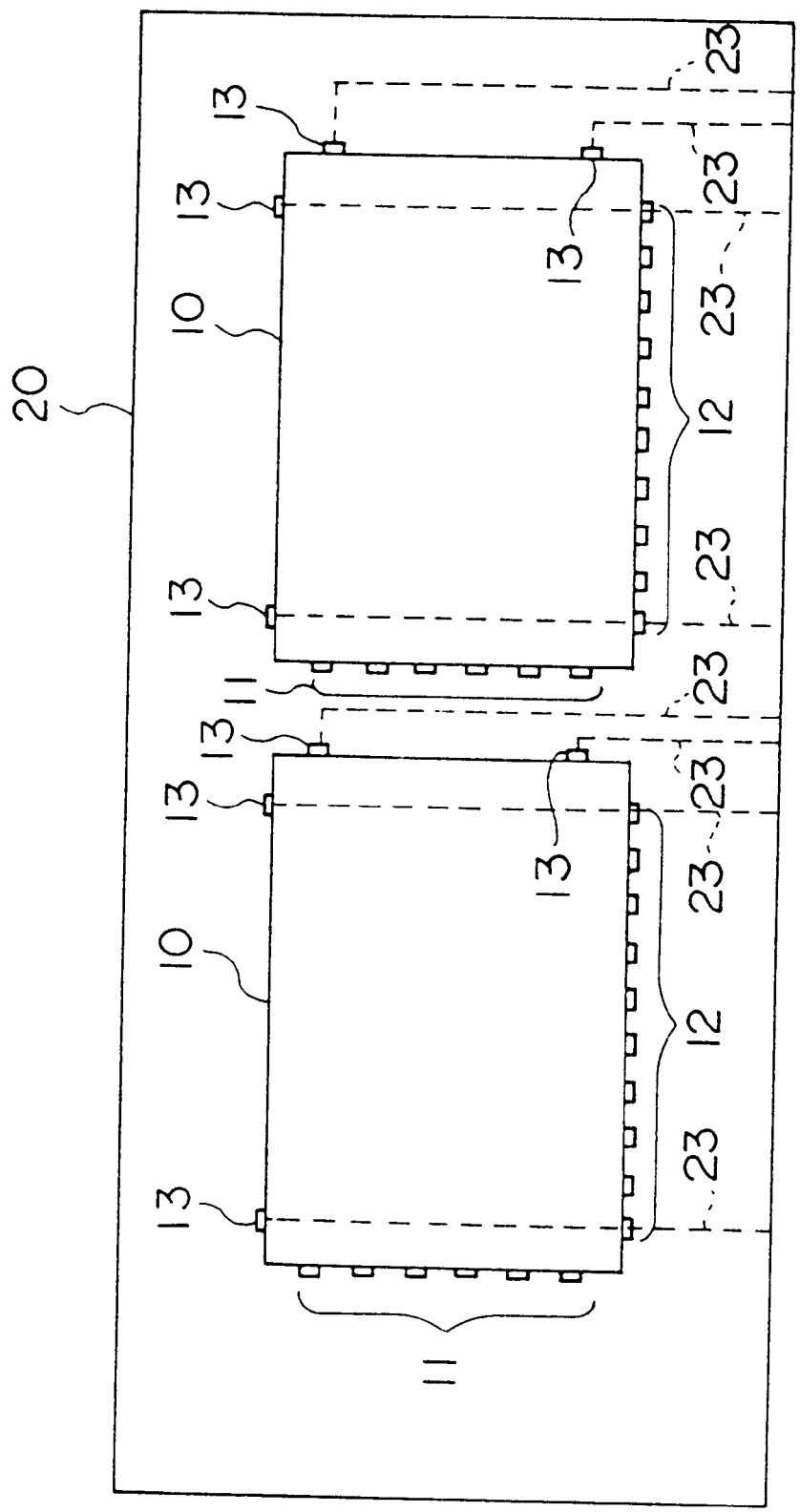
FIG. 3 is an illustrative drawing showing an arrangement of semiconductor devices and a layout of power-supply lines connected to power-input pins when the semiconductor devices of FIG. 1 are mounted on a board.

FIG. 3 is an illustrative drawing showing an arrangement of semiconductor devices and a layout of power-supply lines connected to the power-input pins 13 when the semiconductor devices 10 of FIG. 1 are mounted on a board. In general, a semiconductor device has power-input pins at various positions on the housing of the semiconductor device in order to minimize the lengths of power-supply lines inside the semiconductor device. When such a semiconductor device is mounted on a board, it is a general practice to provide a separate wiring layer for power supply in addition to wiring layers for signal supply.

In FIG. 3, the power-supply lines 23, shown by dashed lines, are provided on a different layer from the layers for the control-signal lines 21 and the bus lines 22 (shown in FIG. 2). In this manner, power-supply lines are laid out in the same manner as in a conventional layout. The principle of the present invention is aimed at providing signal lines (control-signal lines and data-signal lines) other than the power-signal lines in a simple wiring layout using a smaller number of wiring layers. Accordingly, the power-input pins 13 can be positioned at any side of the semiconductor device 10 as previously mentioned.

In this manner, the pin arrangement according to the principle of the present invention can provide connections between the semiconductor devices by using a small number of wiring layers and a simple wiring layout. Since there is no branch stemming from the control-signal lines, signal reflections can be avoided to achieve high-speed data transmission using high-frequency signals.

Figure 4:
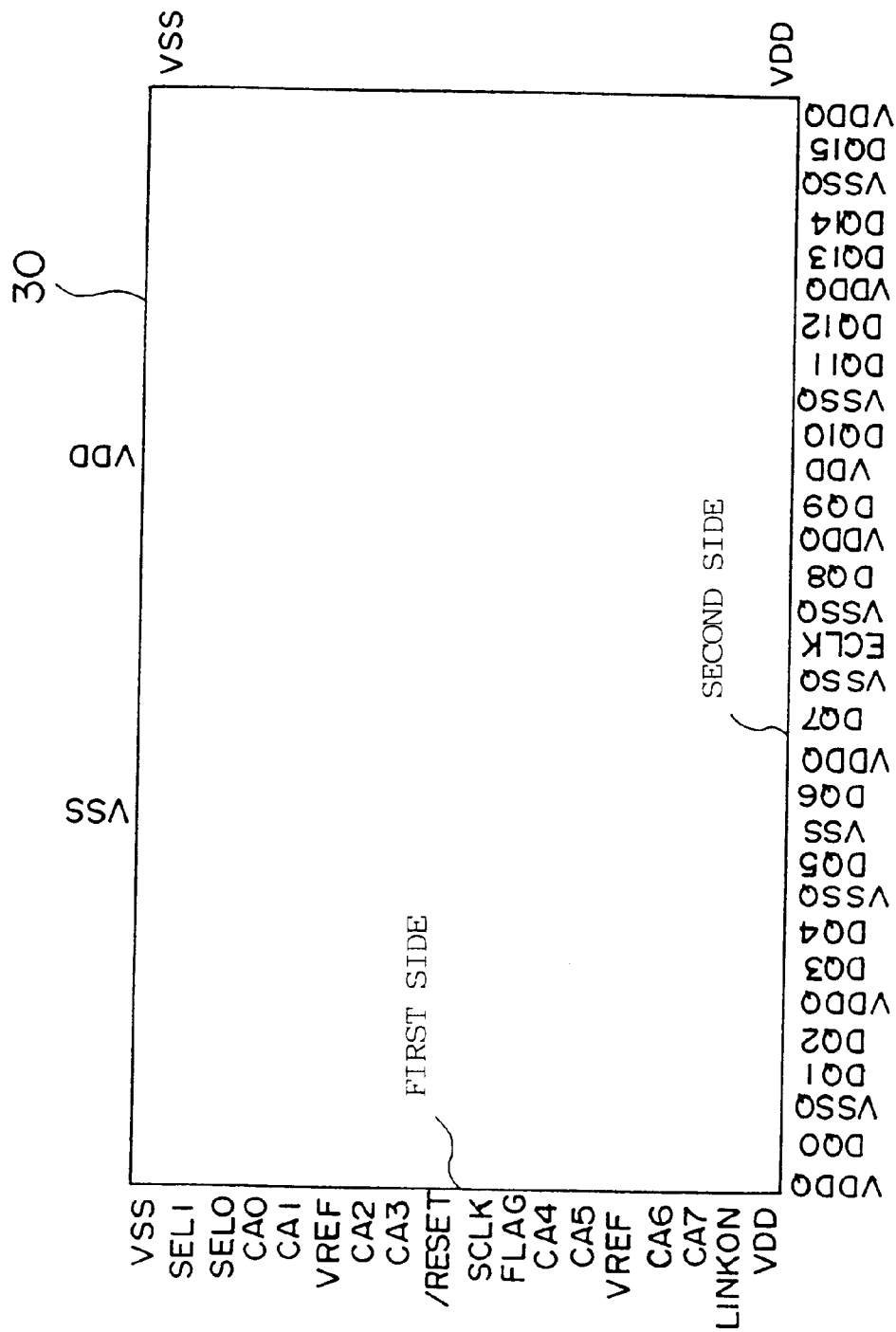
FIG. 4 is an illustrative drawing showing a first embodiment according to the pin arrangement of the present invention.

FIG. 4 is an illustrative drawing showing a first embodiment according to the pin arrangement of the present invention. In this example, a memory device 30 is given as a semiconductor device. In FIG. 4, pins CA0 through CA7, SELI, SELO, /RESET, FLAG, and LINKON are control-signal pins, and pins SCLK and ECLK are clock-input pins. Further, a pin VREF is used for inputting a reference voltage, and pins VDD, VSS, VDDQ, VSSQ are power-input pins. Finally, pins DQ0 through DQ15 are data-input/output pins connected to a bus.

The pin SCLK is used for inputting a clock (strobe) signal to the memory device 30 from another device. The pin ECLK is used for outputting a clock (strobe) signal from the memory device 30 to supply it to another device. The embodiment assumes that a data outputting device supplies a clock to a data receiving device in order to effect data synchronization between these two devices. The memory device 30 of FIG. 4 is an example of devices used in such a system.

As shown in FIG. 4, the first side of the memory device 30 is provided with all the control-signal pins, i.e., the pins CA0 through CA7, SELI, SELO, /RESET, FLAG, and LINKON. The first side is also provided with power-input pins VSS and VDD, the reference-voltage-input pin VREF, and the clock-input pin SCLK. The clock-input pin SCLK is used for inputting a clock signal as mentioned above, and can be regarded as a pin for controlling the memory device 30. That is the reason why the pin SCLK is provided on the first side in this embodiment. Other than the pins for control purposes, the power-input pins VSS and VDD and the reference-voltage-input pin VREF are arranged on the first side. As described with reference to the principle of the present invention, the power-input pins can be provided at any side of the memory device 30.

The second side of the memory device 30 is provided with the data-input/output pins DQO through DQ15, the power-input pins VDD, VSS, VDDQ, and VSSQ, and the clock-input pin ECLK. The clock-input pin ECLK outputs a clock signal for another device, and, thus, can be regarded as a pin for outputting data. For this reason, the pin ECLK is provided on the second side in this embodiment. The power-input pins VDD, VSS, VDDQ, and VSSQ can be provided at any side of the memory device 30 as described with reference to the principle of the present invention.

In the layout of FIG. 4, the control-signal pins and the data-input/output pins are separately provided at two different sides perpendicular to each other. Use of the memory device 30 having such a pin layout can simplify wiring patterns on the board.

Figure 5:
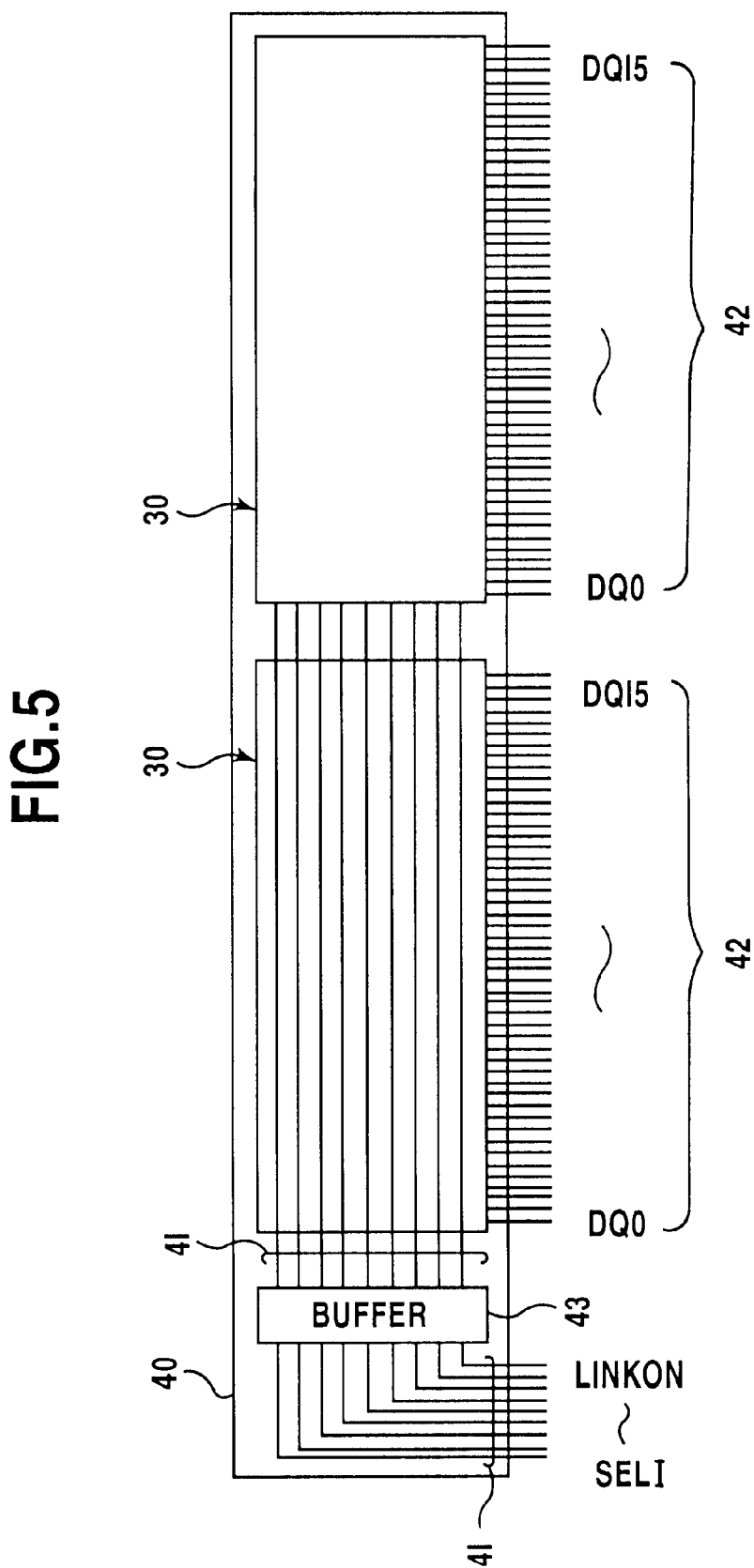
FIG. 5 is an illustrative drawing showing a line layout when a plurality of the memory devices of FIG. 4 are arranged on a board to form SIMM or DIMM.

FIG. 5 is an illustrative drawing showing a line layout when a plurality of the memory devices 30 of FIG. 4 are arranged on a board to form a SIMM (single-in-line memory module) or a DIMM (dual-in-line memory module). Although FIG. 5 does not show a layout of power-supply lines, the power-supply lines are provided on a layer dedicated to power supply as shown by dashed lines in FIG. 3.

In FIG. 5, control-signal lines 41 are basically laid out to run straight on a board 40. In detail, the control-signal lines 41 make a turn at a substantially right angle on an input side of an input buffer 43, which is provided for buffering control signals externally supplied, and are laid out to run straight on an output side of the input buffer 43. A plurality (two in the figure) of the memory devices 30 are arranged such that the first sides thereof extend across the control-signal lines 41. The second sides of the memory device 30 are connected to bus lines 42, which extend towards outside of the board 40.

In this manner, the pin arrangement of the first embodiment can be applied to the SIMM or DIMM to connect each memory device 30 by using a small number of wiring layers and a simple wiring layout. Since there is no branch stemming from the control-signal lines, signal reflections can be avoided to achieve high-speed data transmission using high-frequency signals.

Figure 6:
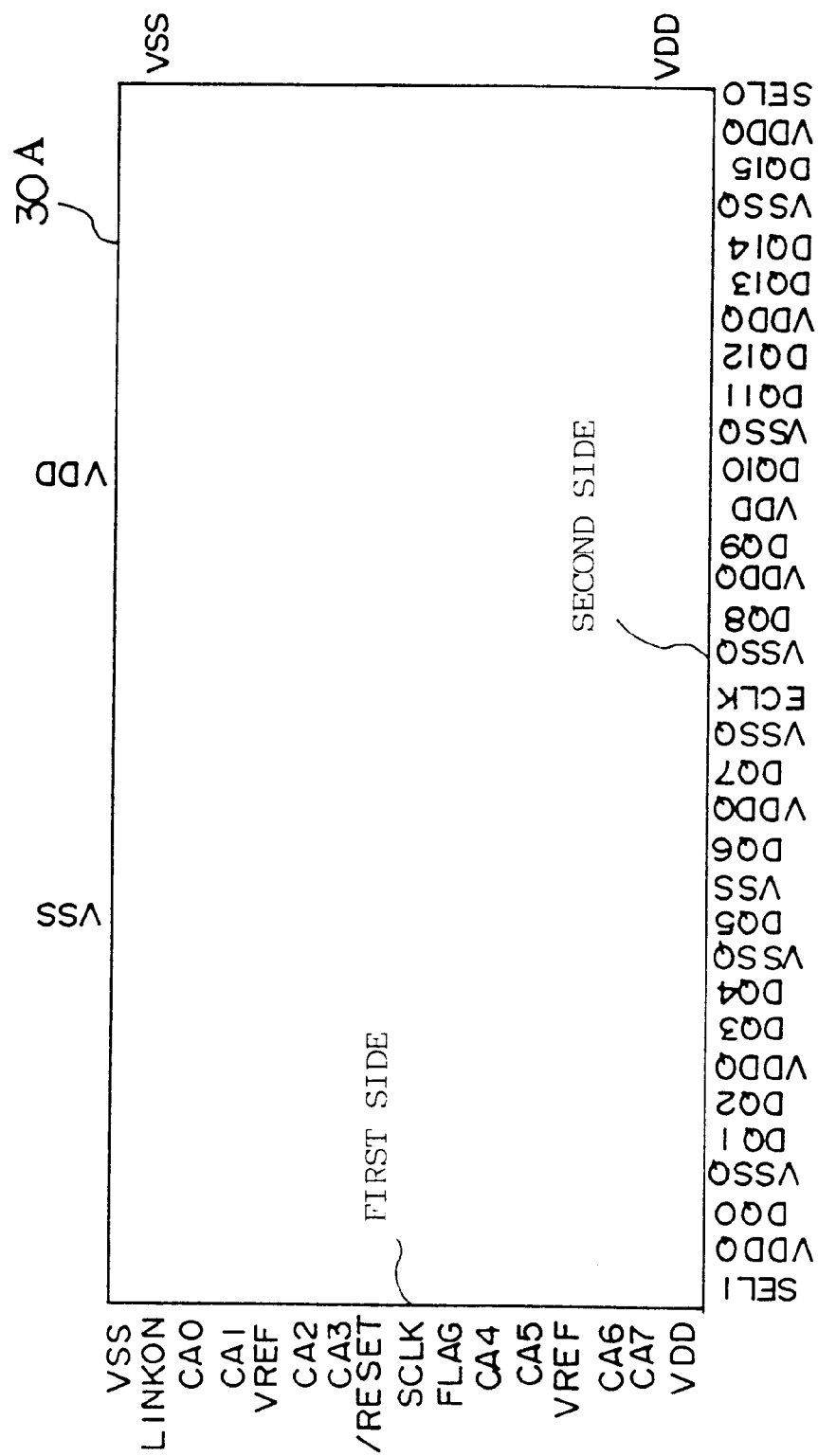
FIG. 6 is an illustrative drawing showing a second embodiment according to the pin arrangement of the present invention.

FIG. 6 is an illustrative drawing showing a second embodiment according to the pin arrangement of the present invention. In this example, a memory device 30A is given as a semiconductor device. In FIG. 6, pin names are the same as those of FIG. 4, and a description thereof will be omitted.

As shown in FIG. 6, the first side of the memory device 30A is provided with the control-signal pins CA0 through CA7, /RESET, FLAG, and LINKON. The first side is also provided with the power-input pins VSS and VDD, the reference-voltage-input pin VREF, and the clock-input pin SCLK. The second side of the memory device 30A is provided with the control-signal pins SELI and SELO, the data-input/output pins DQ0 through DQ15, the power-input pins VDD, VSS, VDDQ, and VSSQ, and the clock-input pin ECLK.

In the pin layout of FIG. 6 according to the second embodiment, the control-signal pins SELI and SELO are arranged on the second side which is the side for data input/output, rather than on the first side as in the first embodiment. The control-signal pins SELI and SELO are assumed to be the pins for setting ID to each chip at an initial state. A signal provided from an external controller or the like is supplied to the pin SELI of the memory device 30A, and an output signal from the pin SELO of this memory device 30A is fed to another memory device 30A, so that this signal can be provided to a plurality of the memory devices 30A via a series connection of the pins SELI and SELO. Accordingly, the pins SELI and SELO can be provided at the same side as that of the data-input/output pins, as laid out in this embodiment. Further, the pins SELI and SELO are preferably provided at either end of the second side to prompt an easy connection of the memory device 30A in a series.

The pins SELI and SELO are only an example. This example is used for underlining that the pin arrangements on the first side and the second side should be decided based on the nature of the signals and connections between the semiconductor devices (memory devices). As described with reference to the principle of the present invention, pins for signals commonly used by all the semiconductor devices are provided on the first side, and pins for signals different between the semiconductor devices are furnished on the second side.

In the layout of FIG. 6, the control-signal pins and the data-input/output pins are separately provided at two different sides perpendicular to each other. Use of the memory device 30A having such a pin layout can simplify wiring patterns on the board.

FIG. 7 is an illustrative drawing showing line layouts when a plurality of the memory devices 30A of FIG. 6 are arranged on a board to form a SIMM or a DIMM. Although FIG. 7 does not show a layout of power-supply lines, the power-supply lines are provided on a layer dedicated to power supply as shown by dashed lines in FIG. 3.

In FIG. 7, control-signal lines 41A are basically laid out to run straight on a board 40A. In detail, the control-signal lines 41A make a turn at a substantially right angle on an input side of an input buffer 43A, which is provided for buffering control signals externally supplied, and are laid out to run straight on an output side of the input buffer 43A. A plurality (two in the figure) of the memory devices 30A are arranged such that the first sides thereof lie across the control-signal lines 41A. The second sides of the memory device 30A are connected to bus lines 42A and lines 44 provided for the pins SELI and SELO. Here, the bus lines 42A extend towards outside of the board 40A.

In this manner, the pin arrangement of the second embodiment can be applied to the SIMM or DIMM to connect each memory device 30A by using a small number of wiring layers and a simple wiring layout. Since there is no branch stemming from the control-signal lines, signal reflections can be avoided to achieve high-speed data transmission using high-frequency signals.

Figure 8A:
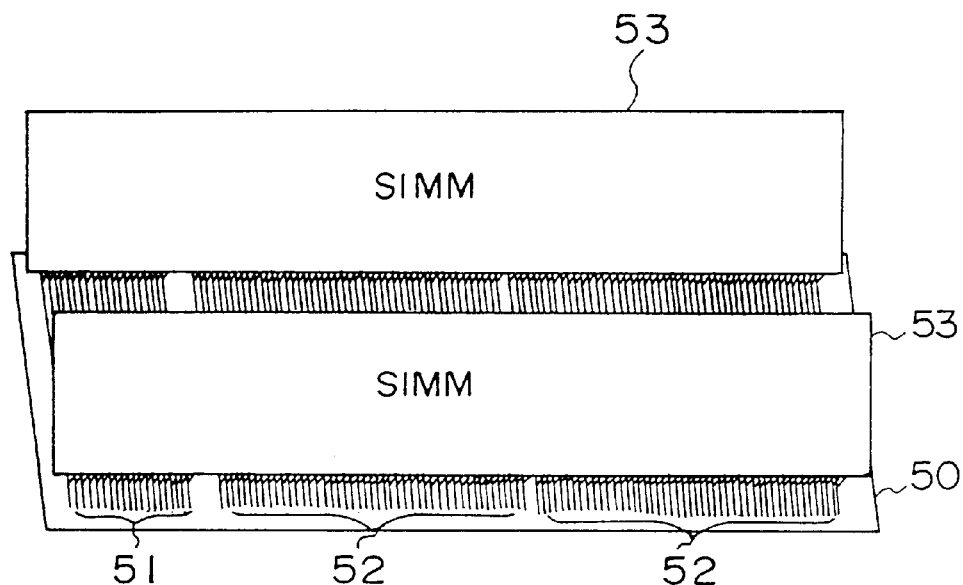
FIGS. 8A and 8B are illustrative drawings showing configurations in which the SIMM (or the DIMM) of FIG. 5
Figure 8B:
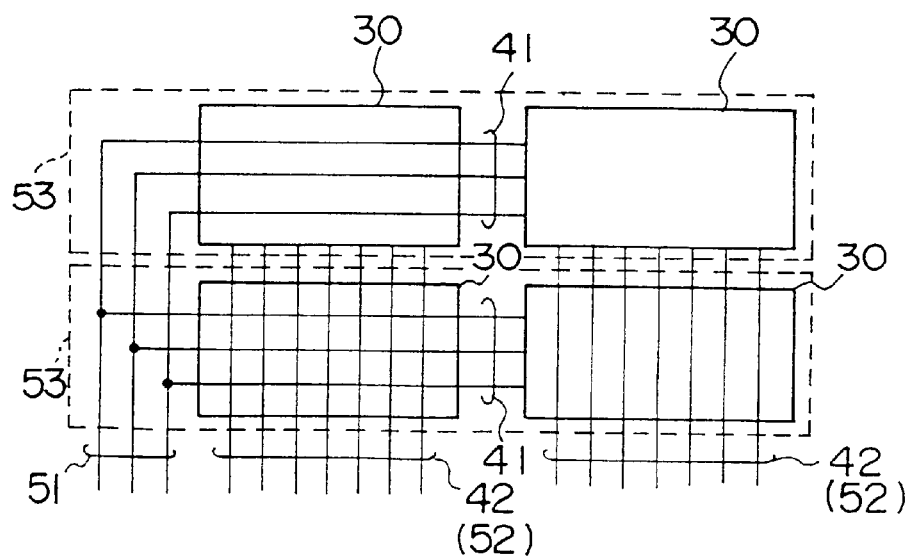

FIGS. 8A and 8B are illustrative drawings showing configurations in which the SIMM (or the DIMM) of FIG. 5 or FIG. 7 is mounted on another board. As shown in FIG. 8A, control-signal lines 51 and bus lines 52 are provided on a board 50, on which a plurality of SIMMs (or DIMMS) 53 are mounted. This configuration achieves a wiring layout as shown in FIG. 8B.

As shown in FIG. 8B, a plurality (two in the figure) of the memory devices 30 are connected to the same control-signal lines 41, which extend straight from the control-signal lines 51 on the board 50. Also, the memory devices 30 of the same number as the number of the SIMMs 53 are connected to the same bus lines 42 (bus lines 52).

In this manner, the SIMM (or the DIMM) of FIG. 5 or FIG. 7 can be mounted on another board so as to built a memory device of a large scale using a small number of wiring layers and a simple wiring layout. Since there is no branch stemming from the control-signal lines, signal reflections can be avoided to achieve high-speed data transmission using high-frequency signals in the large-scale memory device.

As described above, the present invention connects semiconductor chips or semiconductor devices by using simple wiring layouts and a small number of wiring layers. Since there is no branch stemming from the control-signal lines, signal reflections can be avoided to achieve high-speed data transmission using high-frequency signals.

Further, the present invention is not limited to these embodiments, but various variations and modifications may be made without departing from the scope of the present invention.

What is claimed is:

1. A semiconductor device connected to one or more semiconductor devices:
   first pins for receiving signals commonly used with said one or more semiconductor devices; and
   second pins for being connected to signal lines which are not connected to said one or more semiconductor devices,
   wherein all of said first pins are provided on a first side of said semiconductor device and all of said second pins are provided on a second side of said semiconductor device substantially perpendicular to said first side, said first pins and said second pins excluding pins for receiving power voltages.

2. The semiconductor device as claimed in claim 1, further comprising power-input pins provided on at least one of said first side, said second side, a third side opposing said first side, and a fourth side opposing said second side.

3. The semiconductor device as claimed in claim 1, wherein said second pins comprise at least one of pins dedicated to signal input, pins dedicated to signal output, and pins usable for both signal input and signal output.

4. The semiconductor device as claimed in claim 1, wherein said first pins receive control signals for controlling said semiconductor device, and said second pins are connected to data-signal lines for transmission of data signals.

5. The semiconductor device as claimed in claim 4, wherein said control signals comprise at least one of address signals and a clock signal which said semiconductor device uses for an operation thereof.

6. The semiconductor device as claimed in claim 1, further comprising a third pin provided on said second side for outputting a clock signal.

7. The semiconductor device as claimed in claim 1, further comprising a fourth pin provided on said second side for receiving a signal output from said one or more semiconductor devices.

8. The semiconductor device as claimed in claim 7, wherein said fourth pin is provided at an end portion of said second side, said end portion being the nearest of two end portions of said second side to said one or more seminconductor devices.

9. The semiconductor device as claimed in claim 1, comprising a semiconductor memory device.

10. A semiconductor device comprising:
    a semiconductor chip;
    a package housing said semiconductor chip;
    first pins for receiving control signals for controlling said semiconductor chip; and
    second pins for inputting data to and outputting data from said semiconductor chip,
    wherein all of said first pins are provided on a first side of said package and all of said second pins are provided on a second side of said package substantially perpendicular to said first side, said first pins and said second pins excluding pins for receiving power voltages.

11. The semiconductor device as claimed in claim 10, wherein said control signals comprise at least one of address signals and a clock signal which said semiconductor chip uses for an operation thereof.

12. The semiconductor device as claimed in claim 10, further comprising a third pin provided on said second side for outputting a clock signal.

13. The semiconductor device as claimed in claim 10, further comprising power-input pins provided on at least one of said first side, said second side, a third side opposing said first side, and a fourth side opposing said second side.

14. A device comprising:
    a board;
    first signal lines provided on said board to extend straight in a first direction;
    semiconductor packages connected to said first signal lines to share said first signal lines; and
    second signal lines provided on said board to extend in a second direction substantially perpendicular to said first direction, said second signal lines being provided separately for each of said semiconductor packages,
    wherein each of said semiconductor packages comprises:
    first pins connected to said first signal lines; and
    second pins connected to said second signal lines,
    wherein all of said first pins are provided on a first side of each of said semiconductor packages and all of said second pins are provided on a second side of each of said semiconductor packages substantially perpendicular to said first side, said first pins and said second pins excluding pins for receiving power voltages.

15. The device as claimed in claim 14, wherein each of said semiconductor packages further comprises power-input pins, said power-input pins being connected to power-supply lines provided on a layer different from a layer having said first signal lines and said second signal lines in said board.

16. The device as claimed in claim 14, wherein each of said semiconductor packages comprises a semiconductor memory device, said first signal lines being used for inputting control signals for controlling said semiconductor memory device, and said second signal lines being used for inputting data to and outputting data from said semiconductor memory device.

17. The device as claimed in claim 14, wherein said first signal lines and said second signal lines include a portion extending from a side of said board.

18. A device comprising:

a first board;

first signal lines provided on said first board; and a plurality of semiconductor devices mounted on said first board, each of said semiconductor devices comprising:

a second board;

second signal lines provided on said second board to extend straight in a first direction;

semiconductor packages connected to said second signal lines to share said second signal lines;

third signal lines provided on said second board to extend in a second direction substantially perpendicular to said first direction, said third signal lines being provided separately for each of said semiconductor packages; and node portions provided at an end of said second signal lines and said third signal lines and arranged in a line on one side of said second board to be connected to said first signal lines, wherein each of said semiconductor packages comprises:

first pins connected to said second signal lines; and second pins connected to said third signal lines, wherein all of said first pins are provided on a first side of each of said semiconductor packages and all of said second pins are provided on a second side of each of said semiconductor packages substantially perpendicular to said first side, said first pins and said second pins excluding pins for receiving power voltages.

* * * * *